(12) United States Patent
Higashida

(10) Patent No.: US 7,112,828 B2
(45) Date of Patent: Sep. 26, 2006

(54) SEMICONDUCTOR DEVICE

(75) Inventor: Syouji Higashida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 203 days.

(21) Appl. No.: 10/948,670

(22) Filed: Sep. 24, 2004

(65) Prior Publication Data

US 2005/0067632 A1   Mar. 31, 2005

(30) Foreign Application Priority Data

Sep. 29, 2003 (JP) .............................. 2003-337630

(51) Int. Cl.
*H01L 29/73*   (2006.01)
*H01L 29/74*   (2006.01)
*H01L 31/182*  (2006.01)
*H01L 29/80*   (2006.01)
*H01L 31/112*  (2006.01)
*H01L 23/62*   (2006.01)

(52) U.S. Cl. ...................... 257/175; 257/262; 257/362; 257/E29.014

(58) Field of Classification Search ................ 257/175, 257/262, 356, 360, 361, 362, E29.014
See application file for complete search history.

(56) References Cited

U.S. PATENT DOCUMENTS 5,005,061 A * 4/1991 Robb et al. .................. 257/262
6,518,815 B1 * 2/2003 Grimaldi et al. ............. 327/310
6,768,171 B1 * 7/2004 Disney ....................... 257/342
6,777,749 B1 * 8/2004 Rumennik et al. ........... 257/343
2001/0022525 A1 * 9/2001 Grimaldi et al. ............. 327/384
2003/0168919 A1 * 9/2003 Friedrichs et al. ........... 307/113

FOREIGN PATENT DOCUMENTS

| JP | 11-289044   | 10/1999 |
|----|-------------|---------|
| JP | 2000-294778 | 10/2000 |

* cited by examiner

*Primary Examiner*—Ngân V. Ngô
(74) *Attorney, Agent, or Firm*—Keating & Bennett, LLP

(57) ABSTRACT

A semiconductor device that permits an increase in static destruction resistance while preventing an increase in the chip size includes a protective element formed by a polysilicon layer in which JFETs are serially connected in three stages and which is inserted between a gate electrode and source electrode of a power-MOSFET or IGBT semiconductor device. The gate insulation film of a semiconductor active element portion of the semiconductor device is protected regardless of whether the polarity of static electricity or another high voltage is positive or negative.

16 Claims, 7 Drawing Sheets

SEMICONDUCTOR DEVICE

BACKGROUND OF THE INVENTION

1. Field of the Invention

The present invention relates to a semiconductor device such as a power-MOSFET or IGBT (insulated-gate type bipolar transistor) and, more particularly, to a semiconductor device that includes a protective element for protecting a gate insulation film from static electricity or another high voltage.

2. Description of the Related Art

Some semiconductor devices such as power-MOSFETs or IGBTs have a protective element 102 that uses Zener diodes inserted between a gate electrode G and source electrode S, as shown in FIG. 6, in order to prevent a gate insulation film from being destroyed by static electricity or another high voltage. In FIG. 6, D is a drain electrode. This protective element 102 is constituted having four stages in which inverted Zener diodes are alternately connected, for example, and prevents a gate insulation film from being destroyed by either a positive or a negative high voltage. The Zener diodes are not limited to a four-stage constitution. The constitution sometimes has two stages or six or more stages. The number of stages of a Zener diode and the doping concentration of the N-type (or P-type) impurity forming the Zener diode are the main cause of variations in the breakdown voltage and establish a breakdown voltage of between 20 and 30 volts, for example, which is a lower voltage than the upper limit voltage at which the gate insulation film withstands destruction (insulation withstand voltage).

Further, the gate insulation films of semiconductor devices of this type have grown thinner in accordance with the lower power supply voltages of semiconductor devices in recent years and therefore countermeasures to prevent destruction caused by static electricity or other high voltages have become even more important. Although such countermeasures may be considered to increase the surface area of the Zener diode of the above-mentioned protective element and to increase the electrostatic destruction resistance, these countermeasures cannot be said to be preferable because the countermeasures cause an increase in the chip size of the semiconductor device and, in turn, cause an increase in the costs of the semiconductor device.

SUMMARY OF THE INVENTION

In order to overcome the problems described above, preferred embodiments of the present invention provide a semiconductor device that permits an increase in electrostatic destruction resistance while preventing any increase in the chip size of the semiconductor device.

In order to resolve the above-described problems and achieve the advantages of the present invention, a semiconductor device according to a preferred embodiment of the present invention includes a gate insulation film in addition to a gate electrode, a source electrode, and a drain electrode, and a protective element having a plurality of JFETs (Junction Field Effect Transistors) and inserted between the gate and source electrodes.

The protective element can be constituted to operate as a plurality of Zener diodes. In addition, the protective element can be provided by serially connecting at least a first JFET, the source and gate of which are connected to the gate electrode and a second JFET, the source and gate of which are connected to the source electrode.

Further, the protective element can be constituted by a polysilicon layer and can be disposed below the bonding pad of the gate electrode.

The semiconductor device according to preferred embodiments of the present invention preferably uses, as a protective element, JFETs that allow current to flow (release charge) to the source electrode when static electricity is applied to the gate electrode and the potential thereof starts to rise. Therefore, the electrostatic destruction resistance can be increased and therefore an increase in the chip size can be prevented.

Other features, elements, steps, characteristics and advantages of the present invention will become more apparent from the following detailed description of the present invention with reference to the attached drawings.

DETAILED DESCRIPTION OF PREFERRED EMBODIMENTS

Figure 1:
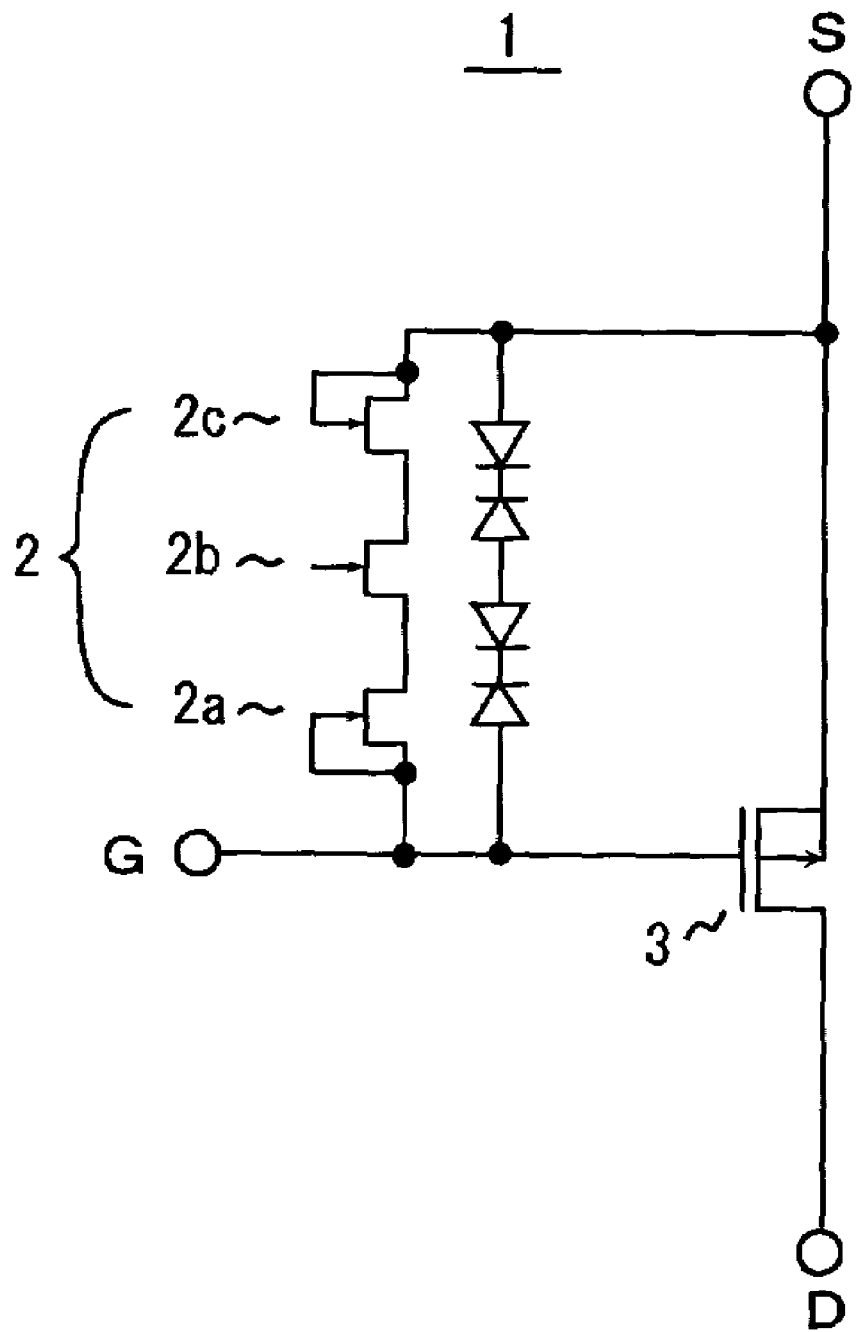
FIG. 1 is a circuit diagram of the semiconductor device according to a preferred embodiment of the present invention.

Preferred embodiments of the present invention will be described hereinbelow with reference to the drawings. FIG. 1 is a circuit diagram of the semiconductor device according to a preferred embodiment of the present invention. A semiconductor device 1, which is preferably a power-MOSFET, IGBT or the like, includes a gate insulation film in a semiconductor active element section 3 in addition to a gate electrode G, a source electrode S, and a drain electrode D. Further, as will be described subsequently, a protective element 2 having a plurality of JFETs (junction field effect transistors) 2a, 2b and 2c is inserted between the gate electrode G and source electrode S. Further, as will be described subsequently, the Zener diodes in FIG. 1 are constituted simultaneously when the JFETs 2a, 2b, and 2c constitute the JFET structure. Therefore, the protective element 2 also operates as Zener diodes.

The protective element 2 is preferably constructed by serially connecting the three JFETs 2a, 2b and 2c. More precisely, the three JFETs 2a, 2b and 2c are connected as follows. That is, the JFET 2a on the side of the gate electrode G has the source of the JFET structure (JFET source) and the gate of the JFET structure (JFET gate) thereof commonly connected to the gate electrode G, and the JFET 2c on the side of the source electrode S has the JFET source and JFET gate thereof commonly connected to the source electrode S. The JFET 2b located between the JFET 2a and JFET 2c has a floating JFET gate. Because the JFETs 2b and 2c of the protective element 2 operate when a positive high voltage is applied between the gate electrode G and source electrode S and the JFETs 2a and 2b operate when a negative high voltage is applied therebetween, destruction of the gate insulation film of the semiconductor device 1 is prevented when either a positive or negative high voltage is applied between the gate electrode G and source electrode S. That is, the protective element 2 permits an increase in the electrostatic destruction resistance of the semiconductor device 1.

Figure 2:
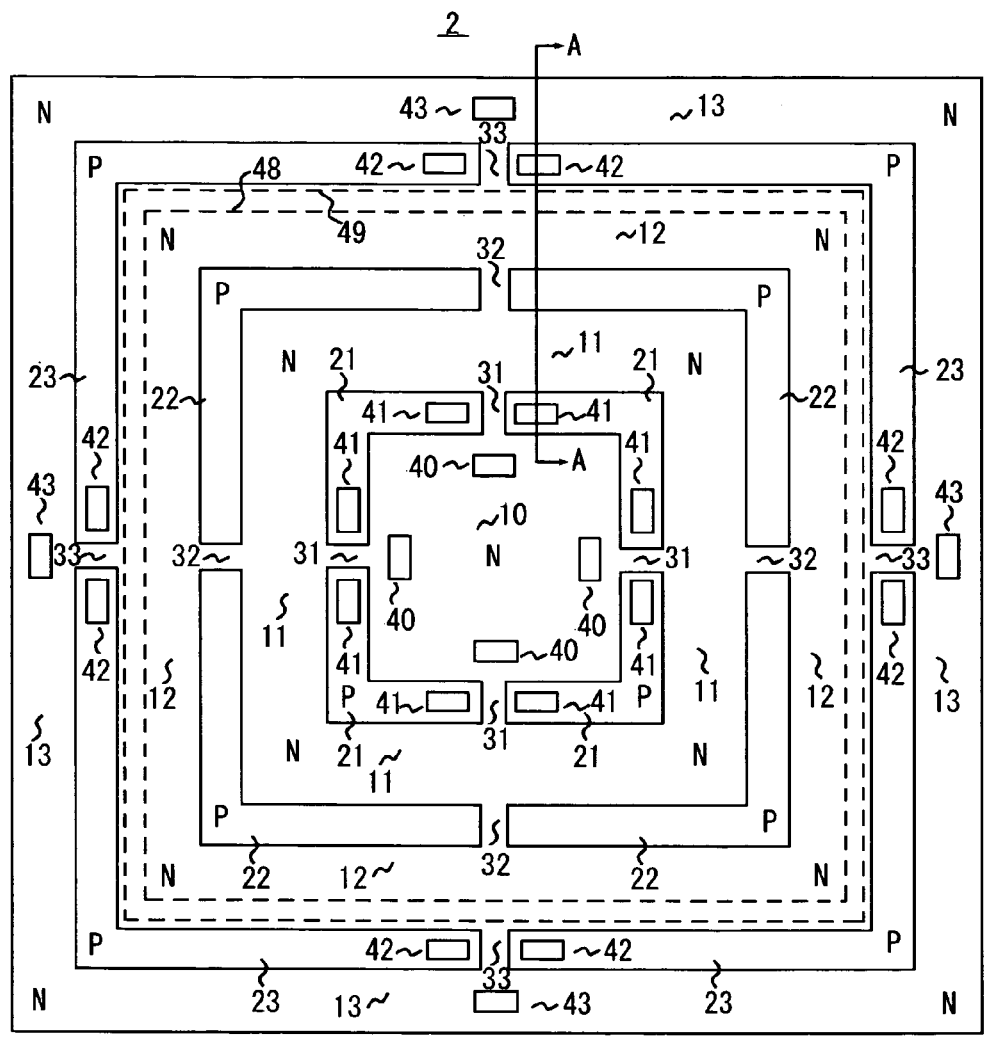
FIG. 2 is a planar view of a protective element for protecting the gate thereof.

FIG. 2 shows a specific example of the planar shape of the protective element 2. The protective element 2 is preferably formed using a polysilicon layer. That is, an N-type region 13, a P-type region 23, an N-type region 12, a P-type region 22, an N-type region 11, and a P-type region 21, each of which forms an angular ring, are disposed sequentially from the outside in the substantially square-shaped polysilicon, and a square-shaped N-type region 10 is formed in the very middle (in the center). Further, gaps (channel portions) 31, 32, 33 are provided in the middle of each of the four sides of the P-type regions 21, 22, and 23 respectively.

When FIG. 2 is associated with the circuit diagram in FIG. 1, the P-type region 21 becomes the JFET gate of the JFET 2a forming the protective element 2, and the gap (channel portion) 31 in the P-type region 21 becomes the channel of the JFET structure (JFET channel). Further, the N-type region 10 is then the JFET source and the N-type region 11 is the drain of the JFET structure (JFET drain). Likewise, the P-type region 22 then becomes the JFET gate of the JFET 2b and the gap (channel portion) 32 in the P-type region 22 becomes the JFET channel. Further, the N-type region 11 or 12 is the JFET source or JFET drain. Likewise, the P-type region 23 becomes then JFET gate of the JFET 2c and the gap (channel portion) 33 in the P-type region 23 becomes the JFET channel. Further, the N-type region 13 then becomes the JFET source and the N-type region 12 becomes the JFET drain.

The protective element 2 is connected between the gate electrode G and source electrode S of the semiconductor device 1, as described above. That is, the protective element 2 is connected to a bonding pad 48 of the gate electrode G via viaholes 40 and 41 that are formed respectively in the N-type region 10 constituting the JFET source of the JFET 2a and the P-type region 21 constituting the JFET gate of the JFET 2a, and to wiring 49 of the source electrode S through viaholes 43 and 42 that are formed respectively in the N-type region 13 constituting the JFET source of the JFET 2c and the P-type region 23 constituting the JFET gate of the JFET 2c.

What warrants attention here is that, in the protective element 2, a PN junction between the P-type region 21 and N-type region 11, a PN junction between the N-type region 11 and P-type region 22, a PN junction between the P-type region 22 and N-type region 12, and a PN junction between the N-type region 12 and P-type region 23 form Zener diodes simultaneously, and these connections constitute an alternately inverted four-stage Zener diode as per the protective element 102 that uses a Zener diode described in the prior art.

Figure 3:
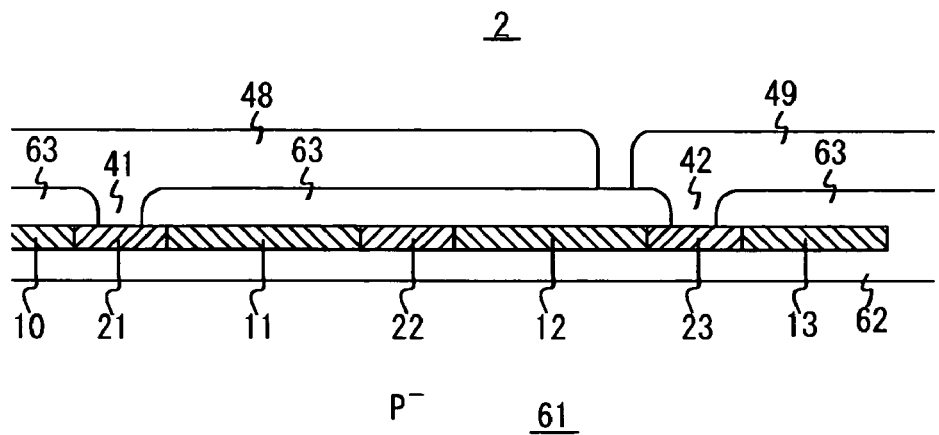
FIG. 3 is a cross-sectional view along the line A—A in FIG. 2.

Next, FIG. 3 shows a cross-sectional view along the section line A—A in FIG. 2 that shows the planar shape of the protective element 2. A polysilicon layer, in which the N-type regions 10, 11, 12 and 13 and P-type regions 21, 22, and 23 that constitute the protective element 2 are alternately formed, is laid on the surface of a P⁻-type semiconductor substrate (also includes an epitaxial layer) 61 via a gate insulation film 62. That is, the protective element 2 is formed by a polysilicon layer. Further, the polysilicon layer is deposited by CVD or another deposition method and then patterned to achieve the desired shape before being doped with N-type or P-type impurities at respective concentrations. The polysilicon layer is then covered with a protective insulation film 63 and then the bonding pad 48 of the gate electrode G and the wiring 49 of the source electrode S, both of which are formed in the metal layer, are laid atop the protective insulation film 63. The viaholes 41 and 42 have been formed in the protective insulation film 63 so that the metal layer and polysilicon make contact with one another through the viaholes 41 and 42.

As mentioned earlier, when the protective element 2 is formed in a polysilicon layer, the same is insulated in the vertical direction by the insulation film 62 and the protective insulation film 63, meaning that only in the horizontal direction (planar direction) is a JFET structure or Zener diode structure produced. Therefore, a parasitic PN junction or similar is not formed in the vertical direction and hence, the vertical structure is not influential. Consequently, the characteristics sought for a JFET structure or Zener diode structure are easily realized.

Further, the protective element 2 is preferably disposed below the bonding pad 48 of the gate electrode G. That is, there is a substantial match between the center of the bonding pad 48 and the center of the protective element 2 that is formed by the polysilicon layer. Further, the bonding pad 48, and the N-type region 10 and P-type region 21 of the protective element 2 are brought into direct contact with one another through the viaholes 40 and 41. The metal wiring 49 of the source electrode S, and the N-type region 13 and P-type region 23 of the protective element 2 are connected through the viaholes 42 and 43 on the outside of the bonding pad 48. Thus, a portion of the area of the bonding pad 48 of the gate electrode G can be shared with the protective element 2.

Figure 4:
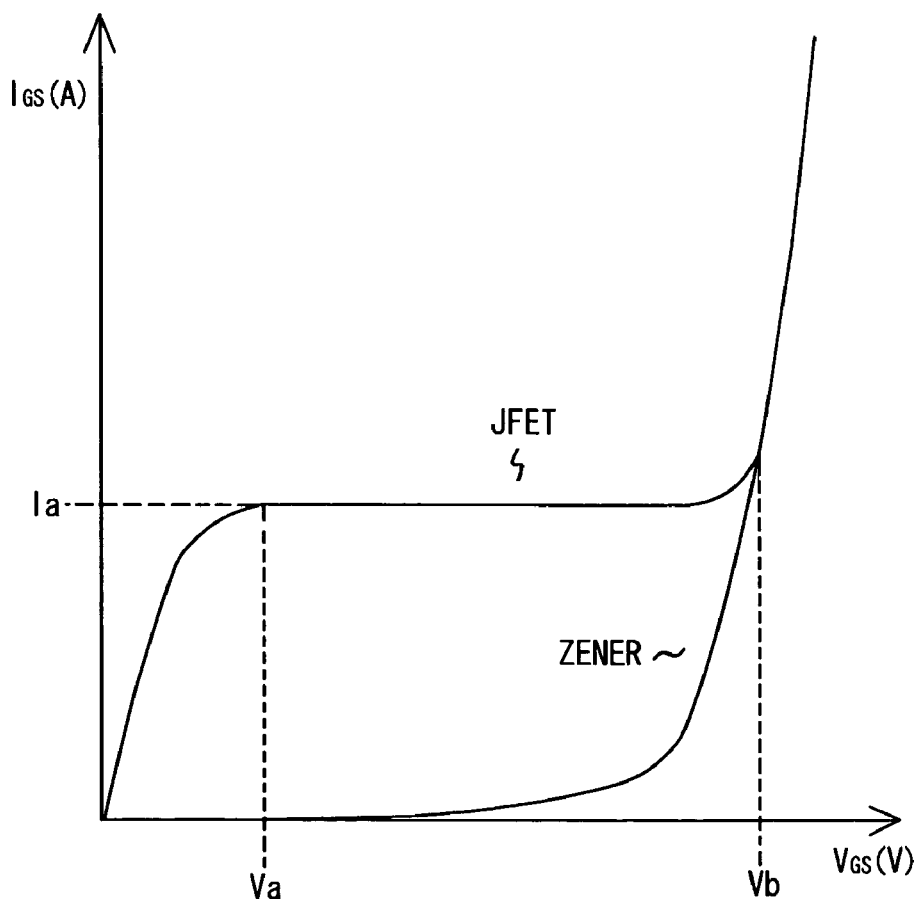
FIG. 4 is a characteristic diagram of the protective element thereof.

Next, the characteristic at the time that a voltage is applied to the protective element 2 will be described on the basis of the characteristic diagram of FIG. 4. Here, the voltage ($V_{GS}$) between the gate electrode G and source electrode S is plotted on the horizontal axis and the current ($I_{GS}$) that flows from the gate electrode G to the source electrode S is plotted on the vertical axis. 'JFET' in FIG. 4 denotes the characteristic curve for the protective element 2, which is a junction field effect transistor, while 'ZENER' is a characteristic curve for the Zener diode that is constituted in the protective element 2. $I_{GS}$ increases linearly between 0 and the point where $V_{GS}$ reaches the saturation voltage (Va), that is, in the linear region. From the saturation voltage (Va) until the breakdown voltage (Vb), that is, in the saturation region, the current of the protective element 2 is a substantially constant saturation current (Ia). Thereafter, when the breakdown voltage (Vb) is reached, breakdown of the Zener diode formed within the protective element 2 is invoked and hence the current of the protective element 2 increases abruptly. Further, although FIG. 4 shows a case where $V_{GS}$ is positive, similar characteristic curves also result in a case where the $V_{GS}$ is negative.

The breakdown voltage Vb (20 to 30 volts, for example) is lower than the insulation withstand voltage of the gate insulation film of the semiconductor device 1 and is a higher voltage than the range in which the user is guaranteed operation. Further, the saturation current (Ia) is made marginally lower than the guaranteed maximum value (10 µA, for example) of the leak current flowing from the gate electrode G to the source electrode S in the semiconductor device 1.

By using a protective element 2 with the above-described characteristics for gate protection, current flows (charge is released) to the source electrode S from the moment the potential of the gate electrode G starts to rise (immediately when same starts to rise) in cases where static electricity or the like is applied to the gate electrode G. This rise of the potential of the gate electrode G can therefore be prevented and the electrostatic destruction resistance can be increased in comparison with the above-mentioned protective element 102 that uses the Zener diode of the prior art. There is therefore no need to use large elements for gate protection and the accompanying increase in chip size can be prevented.

Further, by including a plurality of JFETs in which the JFET gate is a floating gate, as in the case of the JFET 2b, it is possible to increase the breakdown voltage (Vb), and, conversely, decrease the breakdown voltage Vb by leaving out the JFET 2b. Further, the breakdown voltage (Vb) can also be adjusted by the impurity doping concentration of the N-type (or P-type) regions.

Furthermore, the value of the saturation current (Ia) can be adjusted by the width of the channel portion such as the channel portion 33 formed in one P-type region such as the P-type region 23, and by the number of the channel portions provided in parallel, and so forth.

Figure 5A:
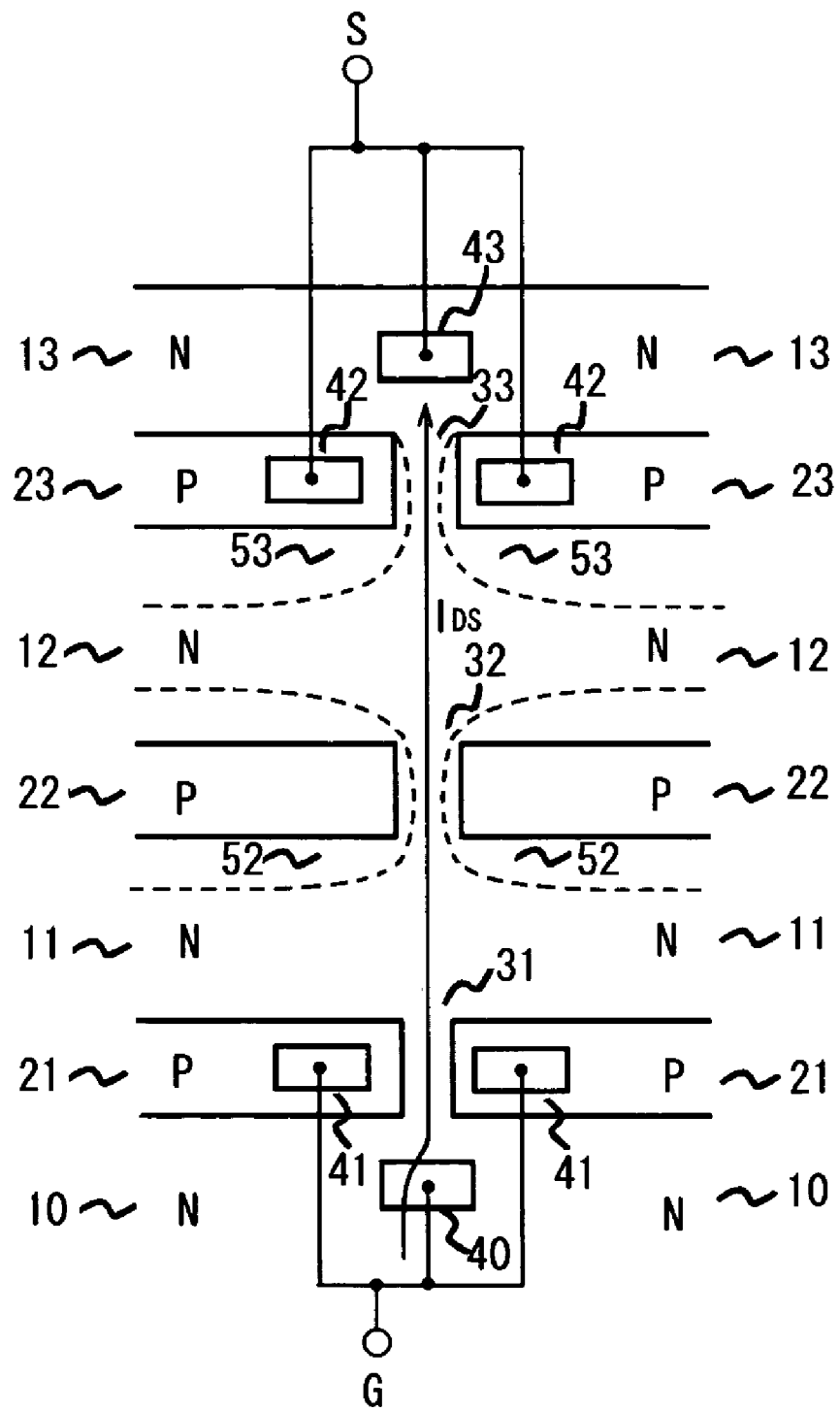
FIGS. 5A to 5C are planar views indicating states of the linear region, the saturation region, and breakdown region respectively of the protective element thereof.
Figure 5B:
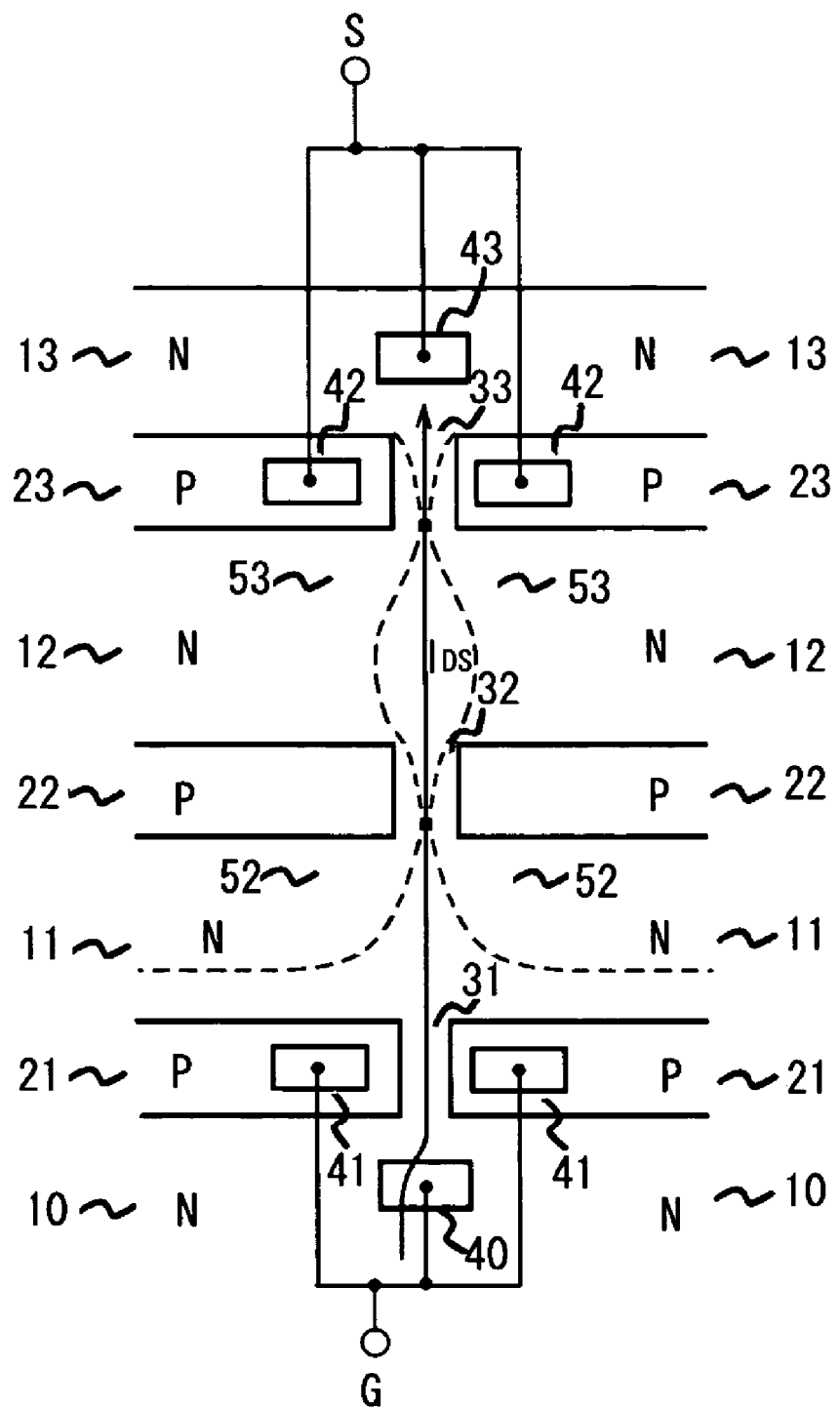
Figure 5C:
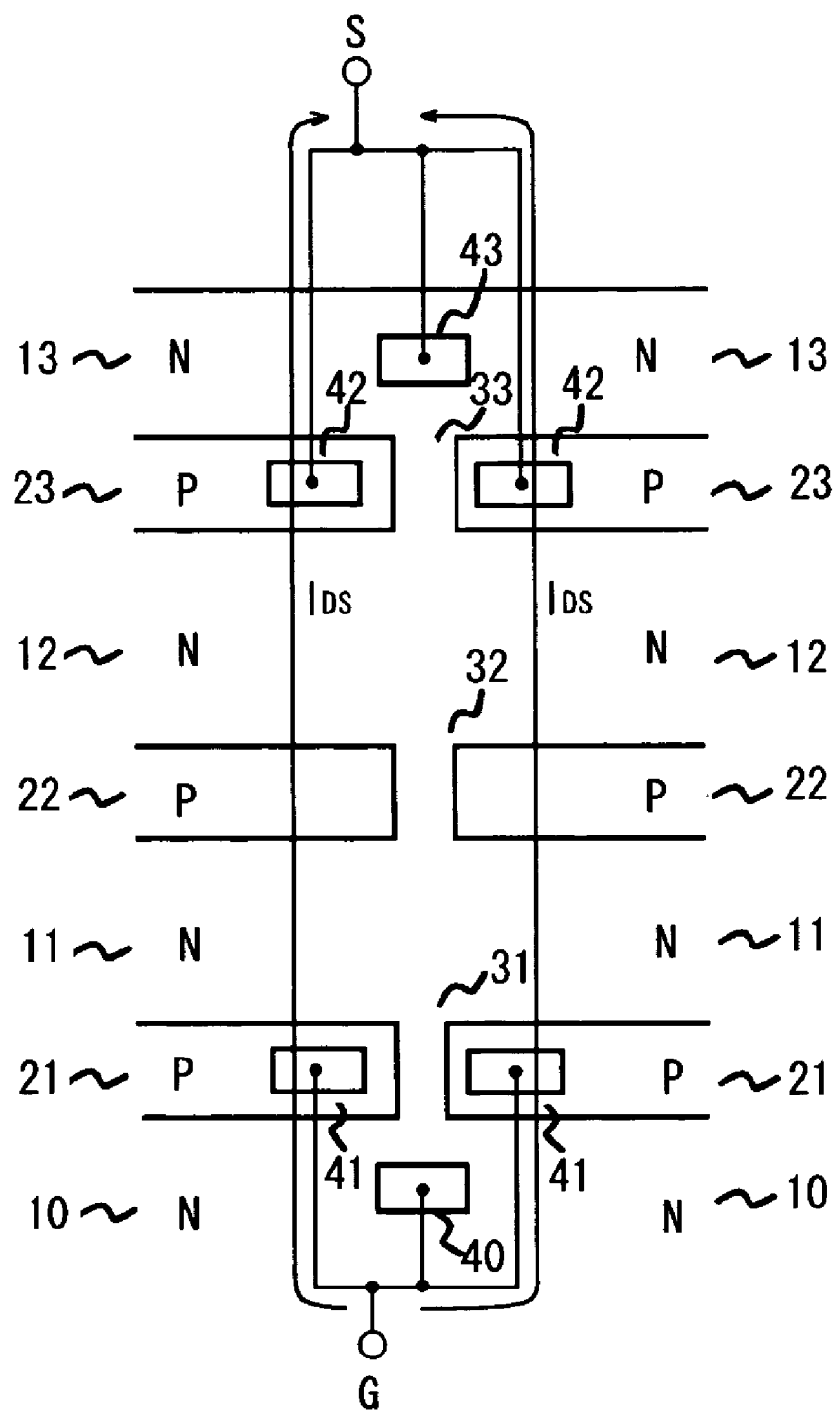
Figure 6:
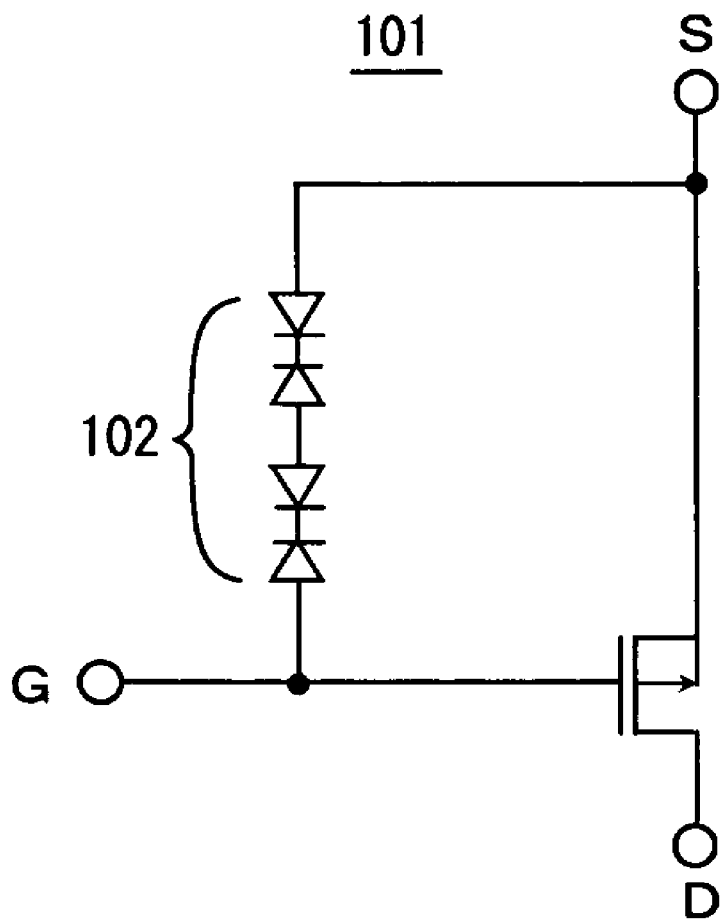
FIG. 6 is a circuit diagram of the semiconductor device of the prior art.

Next, the states of the linear region, saturation region and breakdown region of the protective element 2 are shown in FIGS. 5A, 5B, and 5C respectively to describe the operation of the protective element 2. Each of FIGS. 5A, 5B, and 5C is a planar diagram in which a section of the channel portions 31, 32, and 33 near the section line A—A in FIG. 2 is enlarged. In order to facilitate the description, an outline of the wirings of the gate electrode G and source electrode S has been schematically added.

When a positive voltage is applied between the gate electrode G and source electrode S, until the $V_{GS}$ reaches the breakdown voltage (Vb), that is, in the linear and saturation regions, $I_{GS}$ flows from the gate electrode G through the viahole 40 and then through the channel portions 31, 32, and 33 before flowing to the source electrode S through the viahole 43. Due to the positive voltage, depletion layers 52 and 53 are formed in the N-type region in the vicinity of the P-type regions 22 and 23, as shown in FIG. 5A. The depletion layers 52 and 53 increase in width as $V_{GS}$ increases. When the saturation voltage (Va) is exceeded, that is, in the saturation region, the current path is extremely narrow in one portion of the channel portions 32 and 33, as shown in FIG. 5B. In the saturation region, because a large voltage drop is produced in each of these one portions, even when $V_{GS}$ is increased, $I_{GS}$ is substantially constant. Further, FIG. 5B represents a case where $V_{GS}$ is relatively high and the depletion layer 53 is linked to the depletion layer from the P-type region 22. However, there are also cases in which, when the impurity doping concentration of the N-type region 12 is high or the N-type region 12 is widened, there is no connection across the whole of the saturation region.

When $V_{GS}$ reaches the breakdown voltage (Vb), breakdown of the Zener diodes, which a PN junction between the N-type region 11 and P-type region 22 and a PN junction between the N-type region 12 and P-type region 23 forms, takes place and $I_{GS}$ flows from the gate electrode G through the viahole 41 and then through the P-type region 21, N-type region 11, P-type region 22, N-type region 12, and P-type region 23 before flowing through the viahole 42 to the source electrode S, as shown in FIG. 5C. Thus, as a result of the breakdown, the current path changes from the path through the channel portions 31, 32 and 33 to a path that passes through the P-type or N-type regions 21, 11, 22, 12, and 23, and hence a large current flows.

Further, it is also possible to invoke punchthrough instead of breakdown by lowering the impurity doping concentration of the N-type region 11 or reducing the width thereof. That is, in FIG. 5B, which shows the state of the saturation region, when the depletion layer 52 is enlarged as far as the P-type region 21 by further increasing $V_{GS}$, punchthrough can be invoked before breakdown takes place.

In addition, in cases where a negative voltage is applied between the gate electrode G and source electrode S, $I_{GS}$ passes through the channel portions 33, 32, and 31 in the linear and saturation regions and flows from the source electrode S to the gate electrode G. A depletion layer is also formed in the N-type regions in the vicinity of the P-type regions 21 and 22 and, in the saturation region, a portion of the current path is extremely narrow. Further, in the breakdown region, a large current flows through the P-type or N-type regions 23, 12, 22, 11, and 21.

Further, the present invention is not limited to the above-described preferred embodiments. A variety of design modifications can be performed within the scope of the language appearing in the claims. For example, another protective element can naturally be provided between the gate electrode G and source electrode S. More specifically, Zener diodes other than that of the protective element 2 can also be provided and breakdown induced in the other Zener diodes.

What is claimed is:

1. A semiconductor device comprising:
   a gate insulation film;
   a gate electrode;
   a source electrode;
   a drain electrode; and
   a protective element having a plurality of JFETs and disposed between the gate electrode and the source electrode.

2. The semiconductor device according to claim 1, wherein the protective element is constituted to operate as a plurality of Zener diodes.

3. The semiconductor device according to claim 1, wherein the protective element includes a first JFET, a source and a gate of which are connected to the gate electrode, and a second JFET, a source and a gate of which are connected to the source electrode, the first and second JFETs being serially connected to each other.

4. The semiconductor device according to claim 1, wherein the protective element includes a polysilicon layer.

5. The semiconductor device according to claim 4, wherein the protective element is disposed below a bonding pad of the gate electrode.

6. The semiconductor device according to claim 2, wherein the protective element includes a first JFET, a source and a gate of which are connected to the gate electrode, and a second JFET, a source and a gate of which are connected to the source electrode, the first and second JFETs being serially connected to each other.

7. The semiconductor device according to claim 2, wherein the protective element includes a polysilicon layer.

8. The semiconductor device according to claim 7, wherein the protective element is disposed below a bonding pad of the gate electrode.

9. The semiconductor device according to claim 3, wherein the protective element includes a polysilicon layer.

10. The semiconductor device according to claim 9, wherein the protective element is disposed below a bonding pad of the gate electrode.

11. The semiconductor device according to claim 1, wherein the semiconductor device is one of a power MOSFET and an IGBT.

12. The semiconductor device according to claim 1, wherein the protective element includes at least two JFETs which are serially connected to each other.

13. The semiconductor device according to claim 1, wherein the protective element includes at least three JFETs which are serially connected to each other.

14. The semiconductor device according to claim 1, wherein the protective element includes a first PN junction between a first P-type region and a first N-type region, a second PN junction between the first N-type region and a second P-type region, a third PN junction between the second P-type region and a second N-type region, and a fourth PN junction between the second N-type region and a third P-type region, connected so as to constitute an alternately inverted four-stage Zener diode.

15. The semiconductor device according to claim 1, wherein the protective element is arranged such that a center of the protective element is aligned with a center of a bonding pad of the gate electrode.

16. The semiconductor device according to claim 1, wherein the protective element includes a plurality of JFETs and at least one of the plurality of JFETs has a floating gate.

* * * * *